(12) United States Patent
Hikita et al.

(10) Patent No.: US 7,576,373 B1
(45) Date of Patent: Aug. 18, 2009

(54) NITRIDE SEMICONDUCTOR DEVICE AND METHOD FOR MANUFACTURING THE SAME

(75) Inventors: Masahiro Hikita, Hyogo (JP); Manabu Yanagihara, Osaka (JP); Tetsuzo Ueda, Osaka (JP); Yasuhiro Uemoto, Shiga (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 55 days.

(21) Appl. No.: 11/595,966

(22) Filed: Nov. 13, 2006

(30) Foreign Application Priority Data

Feb. 16, 2006 (JP) .............................. 2006-039404

(51) Int. Cl.
*H01L 31/72* (2006.01)
(52) U.S. Cl. .................. 257/192; 257/194; 257/195; 257/196; 257/197; 257/201
(58) Field of Classification Search ................. 257/192, 257/201, 194–197
See application file for complete search history.

(56) References Cited

U.S. PATENT DOCUMENTS

| 6,281,528 | B1 * | 8/2001 | Wada ......................... 257/200 |
| 7,132,699 | B2 * | 11/2006 | Kimura et al. .............. 257/192 |
| 2005/0189959 | A1 | 9/2005 | Cohen et al. | |

FOREIGN PATENT DOCUMENTS

| JP | 11-261053 A | 9/1999 |
| JP | 2003-133332 | 5/2003 |
| JP | 2004-273486 | 9/2004 |
| JP | 2005-086102 | 3/2005 |

OTHER PUBLICATIONS

J. K. Abrokwah et al., "High-Performance Self-Aligned p+/n GaAs Epitaxial JFET's Incorporating AlGaAs Etch-Stop Layer" IEEE Transactions on Electron Devices, vol. 37, No. 6, pp. 1529-1531, 1990.
L. Zhang et al., "Epitaxially-Grown GaN Junction Field Effect Transistors" IEEE Transactions on Electron Devices, vol. 47, No. 3, pp. 507-511, 2000.

* cited by examiner

*Primary Examiner*—Cuong Q Nguyen
*Assistant Examiner*—Trang Q Tran
(74) *Attorney, Agent, or Firm*—McDermott Will & Emery LLP

(57) ABSTRACT

An AlN buffer layer, an undoped GaN layer, an undoped AlGaN layer, a first p-AlGaN layer, a second p-AlGaN layer and a high concentration p-GaN layer are formed in this order on a substrate. A gate electrode establishes ohmic contact with the high concentration p-GaN layer. A source electrode and a drain electrode are formed on the undoped AlGaN layer. Two-dimensional electron gas generated at the interface between the undoped AlGaN layer and the undoped GaN layer and the first and second p-AlGaN layers form a pn junction in a gate region. The second p-AlGaN layer covers a SiN film in part.

10 Claims, 6 Drawing Sheets

NITRIDE SEMICONDUCTOR DEVICE AND METHOD FOR MANUFACTURING THE SAME

BACKGROUND OF THE INVENTION

1. Field of the Invention

The present invention relates to nitride semiconductor devices applicable to power transistors for use in power supply circuits of consumer products, such as television sets.

2. Description of Related Art

In recent years, active research and development have been made on the application of field effect transistors (hereinafter referred to as FETs) using a GaN-based material to high-frequency and high-power devices. Nitride semiconductor materials such as GaN are capable of producing various kinds of mixed crystal such as AlN and InN, as well as heterojunction just like conventionally used arsenic semiconductor materials such as GaAs. At the heterojunction interface between nitride semiconductor layers, high concentration carriers are generated by spontaneous or piezoelectric polarization without injecting any dopants. Therefore, if the nitride semiconductor material is used, the resulting FET is likely to be a depletion mode (normally-on) FET and it is difficult to obtain an enhancement mode (normally-off) FET.

FIG. 8 is a sectional view illustrating a conventional FET having an AlGaN/GaN heterostructure.

In the conventional FET shown in FIG. 8, a low-temperature GaN buffer layer 1802, an undoped GaN layer 1803 and an n-AlGaN layer 1804 are formed on a sapphire substrate 1801 in this order. A source electrode 1805 and a drain electrode 1806 made of a Ti layer and an Al layer are formed on the n-AlGaN layer 1804. A gate electrode 1807 made of a Ni layer, a Pt layer and an Au layer is formed between the source and drain electrodes 1805 and 1806. A SiN film 1808 is formed as a passivation film. This FET is a normally-on FET in which drain current flows when a gate voltage is 0 V due to high concentration two-dimensional electron gas generated at the heterointerface between the undoped GaN layer 1803 and the n-AlGaN layer 1804.

In the current power electronics market, however, most of the devices are normally-off and devices using the nitride semiconductor materials such as GaN are also required to be normally-off. To meet the requirement, a junction field effect transistor (JFET) using a pn junction for the gate in a conventional GaAs compound semiconductor has been proposed and put into actual use (see J. K. Abrokwah et al., IEEE Transactions on Electron Devices, vol. 37, no. 6, pp. 1529-1531, 1990). When the JFET structure is adopted, a pn junction having a higher built-in potential than that of a Schottky junction is used for the gate to increase a gate rise voltage (a voltage at which the gate current is started to flow), thereby reducing gate leakage current. According to a recent report, the JFET structure has been used also in a nitride semiconductor (see L. Zhang et al., IEEE Transactions on Electron Devices, vol. 47, no. 3, pp. 507-511, 2000 and Japanese Unexamined Patent Publication No. 2004-273486).

SUMMARY OF THE INVENTION

In order to achieve a normally-off GaN-based FET, it is necessary to reduce the Al composition in the n-AlGaN layer or reduce the amount of polarization charges by thinning down the n-AlGaN layer. Therefore, it has been difficult to achieve both of the normally-off state and high current density in the FET.

As a solution to the above problem, the present invention provides a normally-off nitride semiconductor device which is applicable to power transistors and capable of obtaining sufficiently high current density.

In order to achieve the object, a nitride semiconductor device according to a first aspect of the present invention includes: a substrate; a first nitride semiconductor layer formed above the substrate; a second nitride semiconductor layer formed on the first nitride semiconductor layer and has band gap energy larger than that of the first nitride semiconductor layer; an insulating film formed on or above the second nitride semiconductor layer and has an opening formed at least in part thereof corresponding to a gate region; a third nitride semiconductor layer of p-type formed on or above the second nitride semiconductor layer to bury the opening in the gate region and cover the insulating film in part; and a gate electrode formed on or above the third nitride semiconductor layer.

According to the structure, two-dimensional electron gas is generated at the interface between the first and second nitride semiconductor layers while the device is operated. This makes it possible to form a pn junction in the gate region. Therefore, even if the applied gate voltage is higher than that in a conventional nitride semiconductor device, gate leakage current is less likely to occur and high drain current is obtained. In this case, the gate electrode is preferably an ohmic electrode. Further, the insulating film serving as a passivation film is partially covered by the third nitride semiconductor layer. This alleviates local electric field concentration that occurs at the drain-side end of the gate region when a high drain voltage is applied, thereby improving breakdown voltage. Moreover, when viewed in plan, the upper part of the third nitride semiconductor layer covering the insulating film has a larger area than the lower part thereof. Therefore, the resistance of the third nitride semiconductor layer is reduced as compared with the case where the insulating film is not covered by the semiconductor layer.

The nitride semiconductor device further includes a fourth nitride semiconductor layer of p-type formed on the second nitride semiconductor layer and below the third nitride semiconductor layer. The insulating film is formed on the fourth nitride semiconductor layer, whereby the occurrence of current collapse is suppressed more effectively.

The fourth nitride semiconductor layer may be depleted. In particular, when the thickness of the fourth nitride semiconductor layer is not larger than the depth of a depletion layer expanding from the interface between the fourth nitride semiconductor layer and the insulating film to the inside of the fourth nitride semiconductor layer, the expansion of the depletion layer into the second nitride semiconductor layer is prevented. As a result, the concentration of the two-dimensional electron gas generated at the interface between the first and second nitride semiconductor layers is prevented from decreasing and the channel resistance is reduced.

As to the nitride semiconductor device of the first aspect of the present invention, the first nitride semiconductor layer may be made of GaN, the second nitride semiconductor layer may be made of $Al_xGa_{1-x}N$ ($0 \leq x \leq 1$), the third nitride semiconductor layer may be made of $Al_yGa_{1-y}N$ ($0 \leq y \leq 1$) and the fourth nitride semiconductor layer may be made of $Al_zGa_{1-z}N$ ($0 \leq z \leq 1$).

A nitride semiconductor device according to a second aspect of the present invention includes: a substrate; a first nitride semiconductor layer formed above the substrate; a second nitride semiconductor layer formed on the first nitride semiconductor layer and has band gap energy larger than that of the first nitride semiconductor layer; a third nitride semiconductor layer of p-type formed on the second nitride semiconductor layer; an insulating film formed on the third nitride semiconductor layer and has an opening formed at least in part thereof corresponding to a gate region; a fourth nitride semiconductor layer of p-type formed on or above the second nitride semiconductor layer to bury the opening in the gate region; and a gate electrode formed on or above the fourth nitride semiconductor layer.

This structure effectively suppresses the occurrence of current collapse.

A method for manufacturing the nitride semiconductor device according to the present invention includes the steps of: (a) forming a first nitride semiconductor layer on a substrate; (b) forming a second nitride semiconductor layer having band gap energy larger than that of the first nitride semiconductor layer on the first nitride semiconductor layer; (c) forming an insulating film having an opening at least in part thereof corresponding to a gate region on or above the second nitride semiconductor layer; (d) depositing a nitride semiconductor on or above the second nitride semiconductor layer to bury the opening in the insulating film to provide a third nitride semiconductor layer of p-type covering the insulating film in part; and (e) forming a gate electrode on or above the third nitride semiconductor layer.

In particular, the ratio of an area of the opening formed in the insulating film to the total area of the insulating film including the opening is set to 4% or less. Therefore, the growth rate of the third nitride semiconductor layer is set higher than a specified value, thereby achieving the third nitride semiconductor layer with a specular top surface. The growth rate of the third nitride semiconductor layer is preferably 11 μm/h or higher.

According to the present invention described above, the gate leakage current is reduced by forming a pn junction in the gate region, thereby achieving a normally-off nitride semiconductor device suitable for high current operation. Further, the nitride semiconductor layers above the channel are prevented from variations in thickness by providing the p-type nitride semiconductor layer on the nitride semiconductor layer in the gate region. This makes it possible to provide the nitride semiconductor device with stable characteristics such as high current density, low leakage current and high breakdown voltage, thereby improving productivity.

DETAILED DESCRIPTION OF THE INVENTION

Hereinafter, explanation of embodiments of the present invention is provided with reference to the drawings.

First Embodiment

Figure 1:
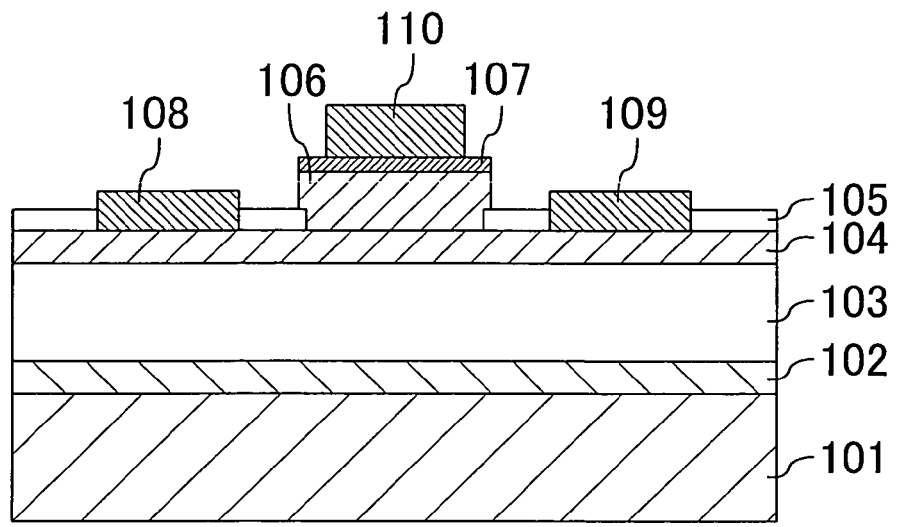
FIG. 1 is a sectional view illustrating a nitride semiconductor device according to a first embodiment of the present invention.

FIG. 1 is a sectional view illustrating a nitride semiconductor device according to a first embodiment of the present invention. The nitride semiconductor device of the present embodiment is a field effect transistor used as a power transistor.

As shown in FIG. 1, the nitride semiconductor device of the present embodiment includes a sapphire substrate 101 having a (0001) plane as a principle surface, a 100 nm thick AlN buffer layer 102 formed on the (0001) plane of the sapphire substrate 101, a 2 μm thick undoped GaN layer 103 formed on the AlN buffer layer 102, a 25 nm thick undoped AlGaN layer 104 formed on the undoped GaN layer 103, a 100 nm thick p-AlGaN layer 106 formed on part of the undoped AlGaN layer 104 and a 5 mm thick high concentration p-GaN layer 107 formed on the p-AlGaN layer 106. The term "undoped" means that impurities are not intentionally introduced into the layer.

The p-AlGaN layer 106 is doped with Mg at a concentration of about $1 \times 10^{19}$ cm$^{-3}$ and the carrier concentration in the p-AlGaN layer 106 is about $1 \times 10^{18}$ cm$^{-3}$. The high concentration p-GaN layer 107 is also doped with Mg at a concentration of about $1 \times 10^{20}$ cm$^{-3}$. In the nitride semiconductor device of the present embodiment, the undoped AlGaN layer 104 and the p-AlGaN layer 106 are both made of undoped $Al_{0.2}Ga_{0.8}N$, for example.

A gate electrode 110 made of palladium (Pd) is formed on the high concentration p-GaN layer 107 to establish ohmic contact with the high concentration p-GaN layer 107. A SiN film 105 having openings is formed on the undoped AlGaN layer 104 and a source electrode 108 and a drain electrode 109 made of a Ti layer and an Al layer are formed in the openings of the SiN film 105 on both sides of the p-AlGaN layer 106, respectively. A high resistance isolation region may be formed around the device region by ion implantation of boron (B).

A principle feature of the nitride semiconductor device of the present embodiment is that the p-AlGaN layer 106 is formed in a gate region to bury the opening in the SiN film 105 and cover the SiN film 105 in part. The term "gate region" means a region including the gate electrode of the nitride semiconductor device and its vicinity when viewed in plan. As the p-AlGaN layer 106 is configured to cover the SiN film 105 in part, local electric field concentration that occurs at the drain-side end of the gate region where the p-AlGaN layer 106 and the SiN film 105 overlap each other is alleviated, thereby increasing breakdown voltage.

Further, when viewed in section, the p-AlGaN layer 106 formed in the gate region is T-shaped. Therefore, resistance at the upper part of the p-AlGaN layer 106 is reduced, thereby reducing the gate resistance.

As another feature of the nitride semiconductor device of the present embodiment, the gate electrode 110 establishes ohmic contact with the high concentration p-GaN layer 103. Therefore, a pn junction is formed in the gate region by the p-AlGaN layer 106 and two-dimensional electron gas generated at the interface between the undoped AlGaN layer 104 and the undoped GaN layer 103. Since the barrier effect by the pn junction is greater than that by a Schottky junction, the nitride semiconductor device of the present embodiment is less likely to cause gate leakage even if the gate voltage is raised higher than that applied in a conventional semiconductor device.

In the nitride semiconductor device of the present embodiment, the thin high concentration p-GaN layer 107 formed below the gate electrode 110 easily establishes the ohmic contact with the gate electrode 110. In general, a p-GaN semiconductor is less likely to achieve ohmic contact as compared with a p-GaAs semiconductor. Therefore, it is preferred to provide the high concentration p-GaN layer 107, though it is not essential. The gate electrode 110 is preferably made of material having high work function such as Pd and Ni. The Al composition in the p-AlGaN layer 106 may be varied from that in the undoped AlGaN layer 104. For example, the p-AlGaN layer 106 may be replaced with a p-GaN layer.

Figure 2:
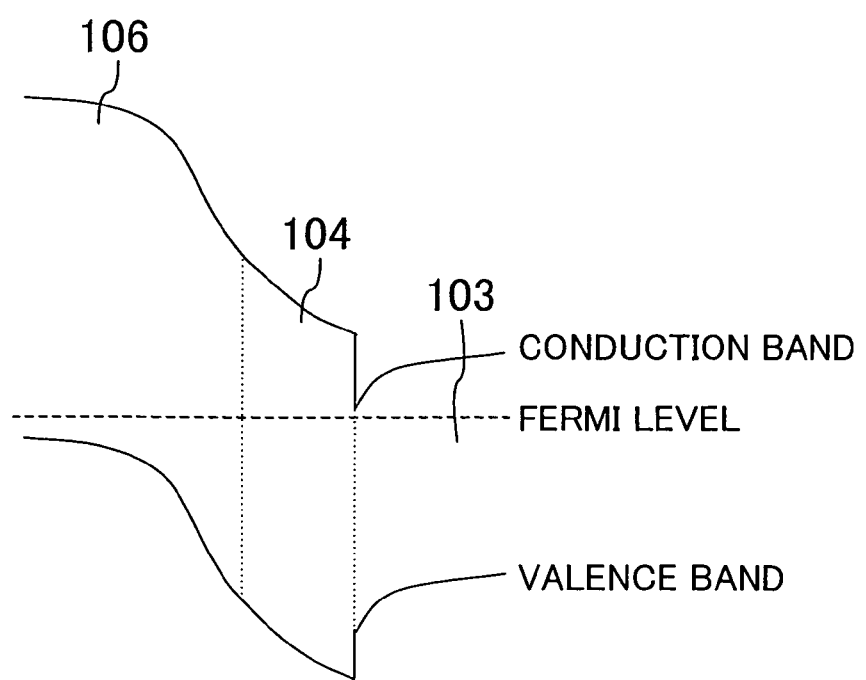
FIG. 2 is an energy band diagram for a longitudinal section of a gate region of the nitride semiconductor device according to the first embodiment.

FIG. 2 is shows an energy band diagram for a longitudinal section of the gate region of the nitride semiconductor device according to the first embodiment.

As shown in FIG. 2, the undoped AlGaN layer 104 and the undoped GaN layer 103 form a heterojunction. At the interface therebetween, charges are generated by spontaneous and piezoelectric polarizations, whereby a recess is formed at the bottom of a conduction band. In the gate region, the p-AlGaN layer 106 is formed on the undoped AlGaN layer 104 as shown in FIG. 2. Therefore, the energy level of the undoped AlGaN layer 104 and the undoped GaN layer 103 is raised and the recess of the conduction band at the heterointerface between the undoped AlGaN layer 104 and the undoped GaN layer 103 is higher than Fermi level. As a result, when a bias voltage is not applied to the gate electrode, the two-dimensional electron gas is not generated in the gate region, i.e., the normally-off state is achieved.

In the other region than the gate region, the p-AlGaN layer 106 is not formed on the undoped AlGaN layer 104. Therefore, the two-dimensional electron gas is generated even if a gate voltage is not applied. Due to the permanent presence of the two-dimensional electron gas in the other region than the gate region, high current is applied between the source and the drain when a positive bias is applied to the gate electrode 110.

When the p-AlGaN layer 106 is grown on the undoped AlGaN layer 104 in the gate region of the nitride semiconductor device of the present embodiment, the p-AlGaN layer 106 is formed with less variations in thickness as compared with the case where the nitride semiconductor layer is formed in the gate region by dry etching.

Figure 3A:
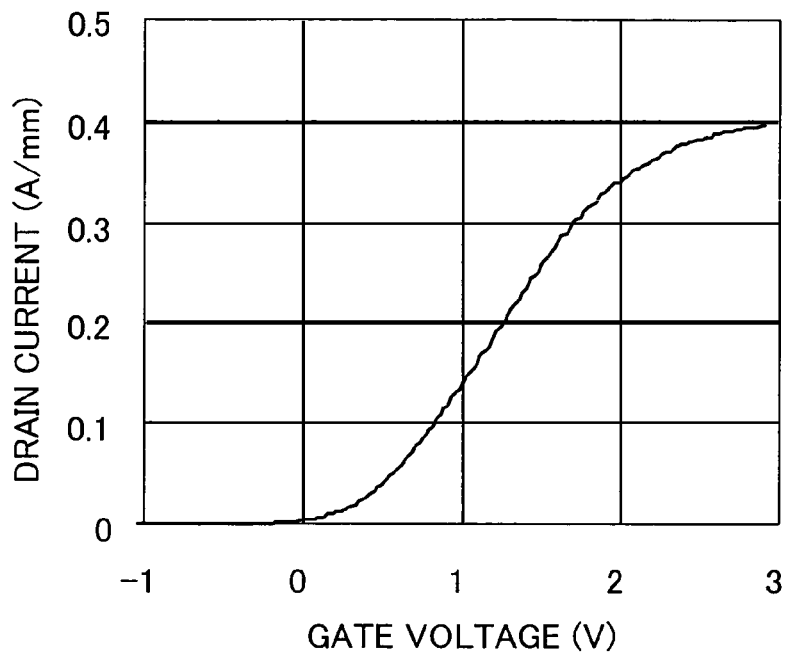
FIG. 3A is a graph illustrating a relationship between gate voltage and drain current in the nitride semiconductor device according to the first embodiment and FIG. 3B is a graph illustrating a relationship between drain current at a specified gate voltage and drain voltage.
Figure 3B:
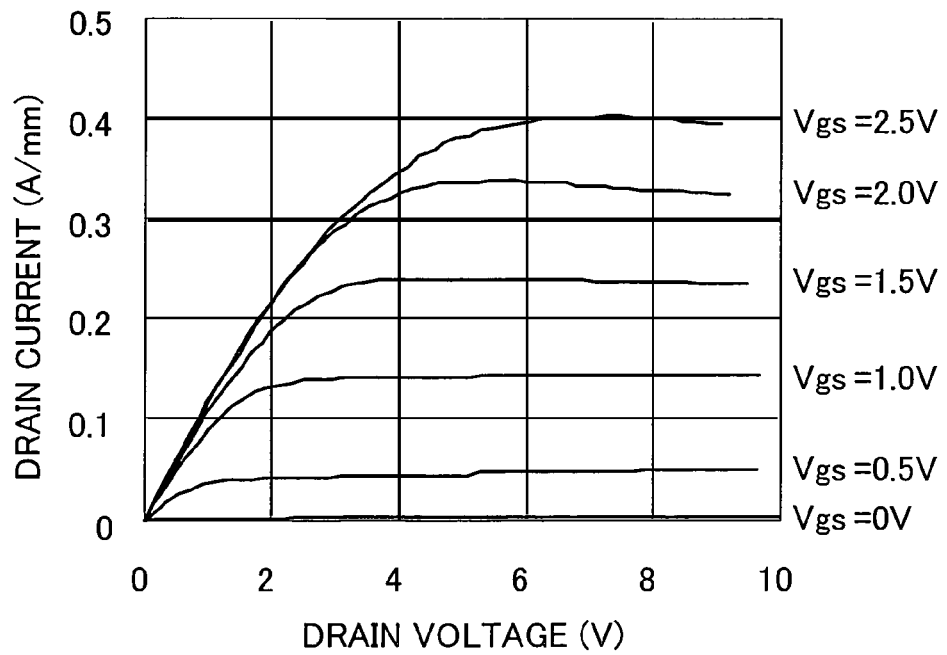

FIG. 3A is a graph illustrating a relationship between gate voltage and drain current in the nitride semiconductor device of the present embodiment and FIG. 3B is a graph illustrating a relationship between drain current at a specified gate voltage and drain voltage. In FIG. 3A, the drain voltage (voltage applied between the source and the drain) is 10 V. In FIG. 3B, the gate voltage (voltage applied between the gate electrode and the source electrode) is 0 to 2.5 V.

As shown in FIG. 3A, the nitride semiconductor device of the present embodiment shows a threshold voltage of about 0 V, providing the normally-off state. Further, as the gate rise voltage is as high as about 3 V, the gate leakage current hardly flows even if a positive bias of 2.5 V is applied to the gate electrode. Thus, a drain current of about 400 mA/mm at the maximum is achieved as shown in FIG. 3B.

Next, explanation of an example of a method for manufacturing the nitride semiconductor device of the present embodiment shown in FIG. 1 is provided. FIGS. 4A to 4E are sectional views illustrating the method for manufacturing the nitride semiconductor device of the present embodiment.

Figure 4A:
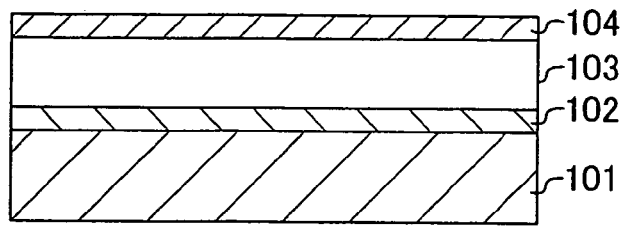
FIGS. 4A to 4E are sectional views illustrating a method for manufacturing the nitride semiconductor device according to the first embodiment.

First, as shown in FIG. 4A, a 100 nm thick AlN buffer layer 102, a 2 μm thick undoped GaN layer 103 and a 25 nm thick undoped AlGaN layer 104 are formed in this order on a (0001) plane of a sapphire substrate 101 by metal organic chemical vapor deposition (MOCVD).

Figure 4B:
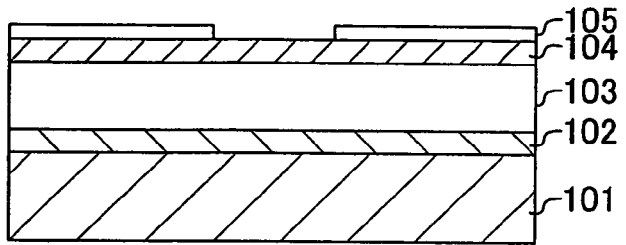

Then, a 50 nm thick SiN film 105 is formed on the undoped AlGaN layer 104 by chemical vapor deposition (CVD) using $SiH_4$, $NH_3$ and $N_2$. Then, an opening is formed in part of the SiN film 105 corresponding to the gate region by wet etching using hydrogen fluoride as shown in FIG. 4B.

Figure 4C:
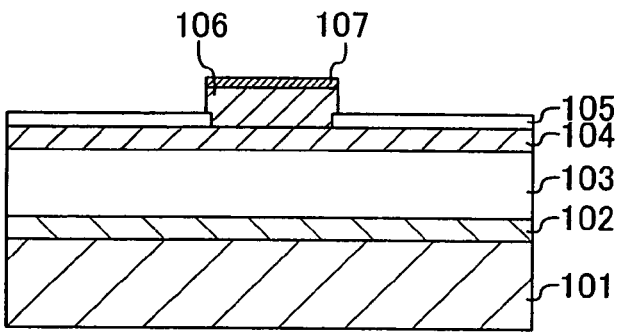

Then, as shown in FIG. 4C, a 100 nm thick p-AlGaN layer 106 and a 5 nm thick high concentration p-GaN layer 107 are selectively grown in the gate region on the substrate by MOCVD using the SiN film 105 as a mask. In this step, the p-AlGaN layer 106 and the high concentration p-GaN layer 107 are grown on the exposed part of the undoped AlGaN layer 104 and part of the SiN film 105 in the gate region. Thus, part of the p-AlGaN layer 106 covers part of the SiN film 105.

Figure 5:
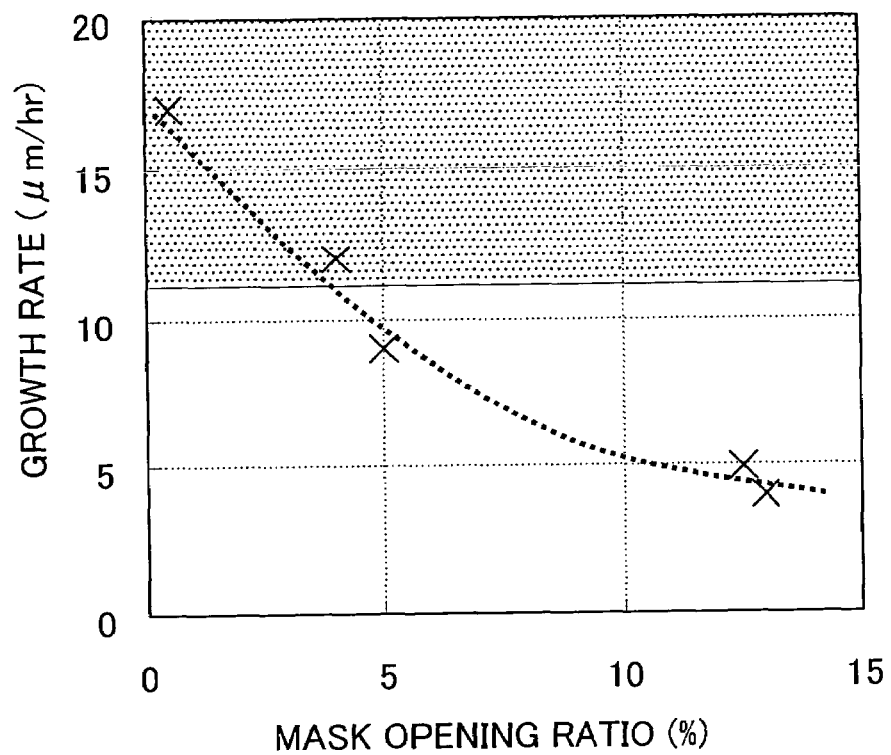
FIG. 5 is a view illustrating a relationship between the opening ratio of a SiN film used as a mask and the growth rate of an AlGaN layer.

FIG. 5 is a graph illustrating a relationship between the opening ratio of the SiN film used as the mask (hereinafter referred to as a mask opening ratio) and the growth rate of the AlGaN layer. The term "mask opening ratio" is a ratio of an area of the openings to the total area of the mask layer including the openings.

As shown in FIG. 5, the growth rate of the AlGaN layer greatly depends on the mask opening ratio. The more the mask opening ratio is reduced, the more the growth rate increases. When the growth rate of the AlGaN layer is low, the obtained AlGaN layer becomes uneven. However, when the growth rate is set to 11 μm/h or higher, the AlGaN layer is obtained with a specular top surface. Under the film formation conditions adopted for the test of FIG. 5, the AlGaN layer with the specular top surface is grown on the AlGaN layer when the mask opening ratio is about 4% or less (and more than 0%). As long as the growth rate is about 11 μm/h or higher, the specular top surface of the AlGaN layer is achieved even if the film formation conditions are varied.

Figure 4D:
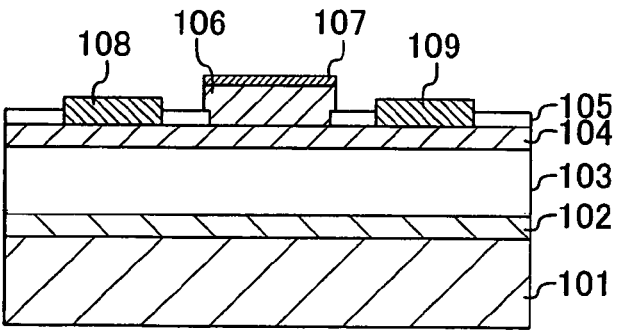

Then, as shown in FIG. 4D, openings are formed in the SiN film 105 to be positioned on both sides of the stack of the p-type GaN layer 106 and the high concentration p-GaN layer 107 by dry etching such as reactive ion etching (RIE) using $CF_4$ gas. Then, a source electrode 108 and a drain electrode 109 made of a Ti layer and an Al layer are formed on parts of the undoped AlGaN layer 104 exposed in the openings of the SiN film 105 by vapor deposition/lift-off, respectively, and then the resulting substrate is thermally treated in $N_2$ atmosphere at 650° C.

Figure 4E:
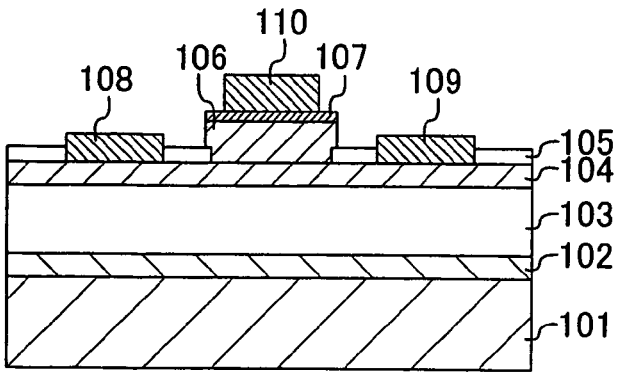

Then, as shown in FIG. 4E, a gate electrode 110 made of Pd is formed on the high concentration p-GaN layer 107 by vapor deposition/lift-off. Thus, the nitride semiconductor device of the present invention is fabricated.

As the principle surface of the substrate, other crystal surface of the sapphire substrate than the (0001) plane may be used. Alternatively, other substrates than the sapphire substrate may be used as long as the nitride semiconductor is grown thereon.

The undoped AlGaN layer 104 may be replaced with an AlGaN layer doped with n-type impurities.

Further, the undoped AlGaN layer 104 may be made of AlN instead of AlGaN.

Second Embodiment

Figure 6:
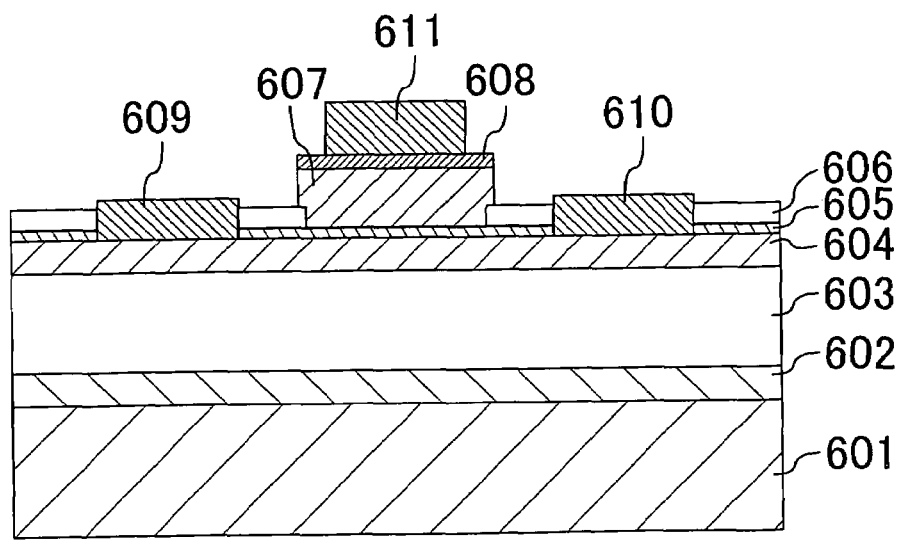
FIG. 6 is a sectional view illustrating a nitride semiconductor device according to a second embodiment of the present invention.

FIG. 6 is a sectional view illustrating a nitride semiconductor device according to a second embodiment of the present invention.

As shown in FIG. 6, the nitride semiconductor device of the present embodiment includes a sapphire substrate 601 having a (0001) plane as a principle surface. On the (0001) plane of the sapphire substrate 601, a 100 nm thick AlN buffer layer 602, a 2 μm thick undoped GaN layer 603, a 25 nm thick undoped AlGaN layer 604, a 5 nm thick first p-AlGaN layer 605 doped with Mg, a 100 nm thick second p-AlGaN layer 607 doped with Mg and a 5 nm thick high concentration p-GaN layer 608 are formed in this order. The undoped AlGaN layer 604, the first p-AlGaN layer 605 and the second p-AlGaN layer 607 are made of $Al_{0.2}Ga_{0.8}N$, for example. The first p-AlGaN layer 605 and the second p-AlGaN layer 607 are doped with Mg at a concentration of about $1\times10^{19}$ $cm^{-3}$, respectively.

The nitride semiconductor device of the present embodiment further includes a gate electrode 611 made of Pd and establishes ohmic contact with the high concentration p-GaN layer 608, a source electrode 609 and a drain electrode 610 made of a Ti layer and an Al layer and establish ohmic contact with the undoped AlGaN layer 604 and a SiN film 606. Since the gate electrode 611 and the high concentration p-GaN layer 608 establish ohmic contact just like in the nitride semiconductor device of the first embodiment, a pn junction is formed in the gate region by two-dimensional electron gas generated at the interface between the undoped GaN layer 603 and the undoped AlGaN layer 604 and the first and second p-AlGaN layers 605 and 607. Therefore, as compared with the case where a Schottky junction is formed by the gate electrode and the high concentration p-GaN layer, the device is driven at a higher gate voltage.

In the same manner as in the first embodiment, an opening is formed in part of the SiN film 606 corresponding to the gate region. The second p-AlGaN layer 607 is formed on part of the first p-AlGaN layer 605 exposed in the opening such that the opening is buried and the SiN film 606 is covered in part.

The difference between the nitride semiconductor device of the present embodiment and that of the first embodiment is that the first p-AlGaN layer 605 is formed between the second p-AlGaN layer 607 (corresponding to the p-AlGaN layer 106 shown in FIG. 1) and the undoped AlGaN layer 604, as well as between the SiN film 606 and the undoped AlGaN layer 604. In a GaN-based FET, the drain current is reduced when the drain voltage is increased, i.e., so-called current collapse occurs. In the nitride semiconductor device of the present embodiment, however, the first p-AlGaN layer 605 is formed on the undoped AlGaN layer 604 in addition to the SiN film 606 serving as a passivation film, thereby suppressing the current collapse more completely. A possible cause of this is that the first p-AlGaN layer 605 which is a semiconductor layer serves as the passivation film by itself to alleviate the effect of surface level on the channel.

The nitride semiconductor device of the present embodiment was actually fabricated and subjected to a performance test. As a result, the current collapse was not observed.

In the nitride semiconductor device of the present embodiment, the thickness of the first p-AlGaN layer 605 is almost the same as the thickness of a depletion layer formed by the surface level (a depletion layer expanding from the interface between the SiN film 606 and the first p-AlGaN layer 605). Therefore, the first p-AlGaN layer 605 is completely depleted by the surface depletion layer except part thereof in the gate region. Accordingly, holes do not exist in part of the first p-AlGaN layer 605 around the gate region. As a result, the concentration of the two-dimensional electron gas generated at the interface between the undoped AlGaN layer 604 and the undoped GaN layer 603 is not reduced, thereby reducing the channel resistance. The nitride semiconductor device of the present embodiment is a normally-off device because the second p-AlGaN layer 607 is formed in the gate region.

The first p-AlGaN layer 605 may be thicker than the surface depletion layer. If the p-AlGaN layer 605 is completely depleted by the surface depletion layer or a depletion layer formed by a junction between the first p-AlGaN layer 605 and the undoped AlGaN layer 604, the transistor is operated without the occurrence of gate leakage current. On the other hand, if the first p-type AlGaN layer 605 is not completely depleted by the surface depletion layer, the depletion layer expands in the undoped AlGaN layer 604. This leads to reduction in the concentration of the two-dimensional electron gas and increase in the channel resistance.

In general, the surface of the nitride semiconductor on which the nitride semiconductor layer is re-grown is once exposed to the atmospheric air. Therefore, if an oxide of Ga or Al is generated at the surface and C remains on the surface, crystal defect is likely to occur. If the interface between these nitride semiconductor layers serves as a pn junction interface in the gate region, the built-in voltage of the pn junction is decreased by the crystal defect and the gate leakage current is possibly increased. However, in the nitride semiconductor device of the present embodiment, the interface between the first p-AlGaN layer 605 and the second p-AlGaN layer 607 does not serve as the pn junction interface. Therefore, the gate leakage current is reduced.

Next, explanation of an example of a method for manufacturing the nitride semiconductor device of the present embodiment is provided.

FIGS. 7A to 7E are sectional views illustrating the method for manufacturing the nitride semiconductor device of the present embodiment.

Figure 7A:
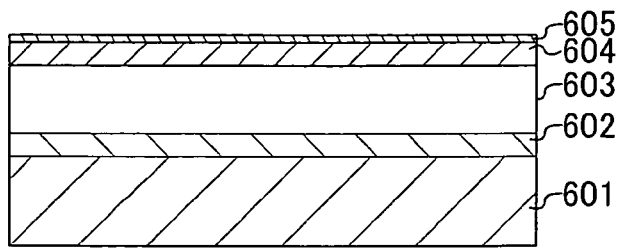
FIGS. 7A to 7E are sectional views illustrating a method for manufacturing the nitride semiconductor device according to the second embodiment.

First, as shown in FIG. 7A, a 100 nm thick AlN buffer layer 602, a 2 μm thick undoped GaN layer 603, a 25 nm thick undoped AlGaN layer 604 and a 5 nm thick first p-AlGaN layer 605 are formed in this order on a (0001) plane of a sapphire substrate 601 by MOCVD.

Figure 7B:
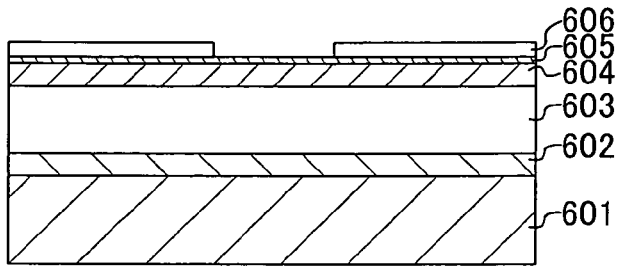

Then, as shown in FIG. 7B, a 50 mm thick SiN film 606 is formed on the undoped AlGaN layer 604 by CVD using $SiH_4$, $NH_3$ and $N_2$. Then, an opening is formed in part of the SiN film 606 corresponding to the gate region by wet etching using hydrogen fluoride.

Figure 7C:
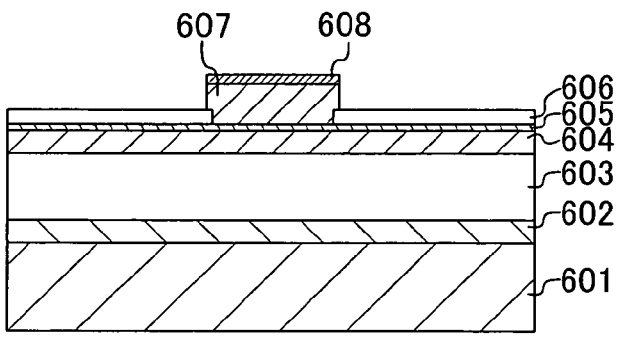

Then, as shown in FIG. 7C, a 100 nm thick second p-AlGaN layer 607 and a 5 nm thick high concentration p-GaN layer 608 are selectively grown on part of the first p-AlGaN layer 605 exposed in the opening formed in the SiN film 606. If the mask opening ratio of the SiN film 606 is suitably adjusted (e.g., 4% or less) to set the growth rate of the second p-AlGaN layer 607 to 11 μm/h, the second p-AlGaN layer 607 is obtained with a specular top surface. The second p-type AlGaN layer 607 is formed to cover part of the SiN film 606.

Figure 7D:
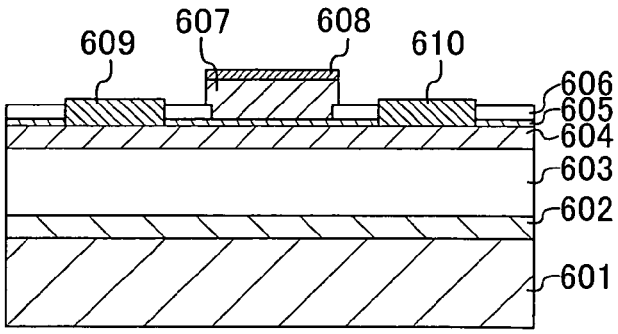

Then, as shown in FIG. 7D, openings are formed in the SiN film 606 and the first p-AlGaN layer 605 to be located on both sides of the second p-AlGaN layer 607 by ICP dry etching using $Cl_2$ gas. Then, a source electrode 609 and a drain electrode 610 made of a Ti layer and an Al layer are formed in the openings, respectively, and thermal treatment is performed in N$_2$ atmosphere at 650° C.

Figure 7E:
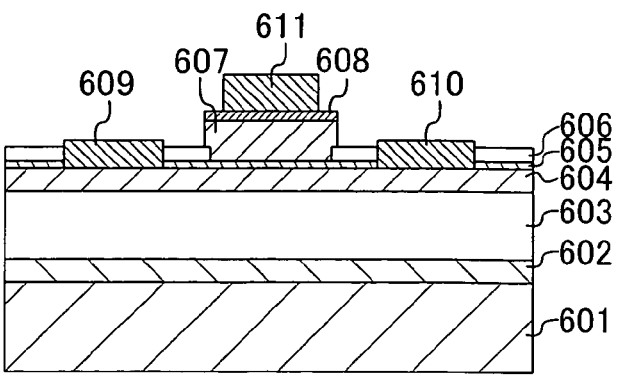
Figure 8:
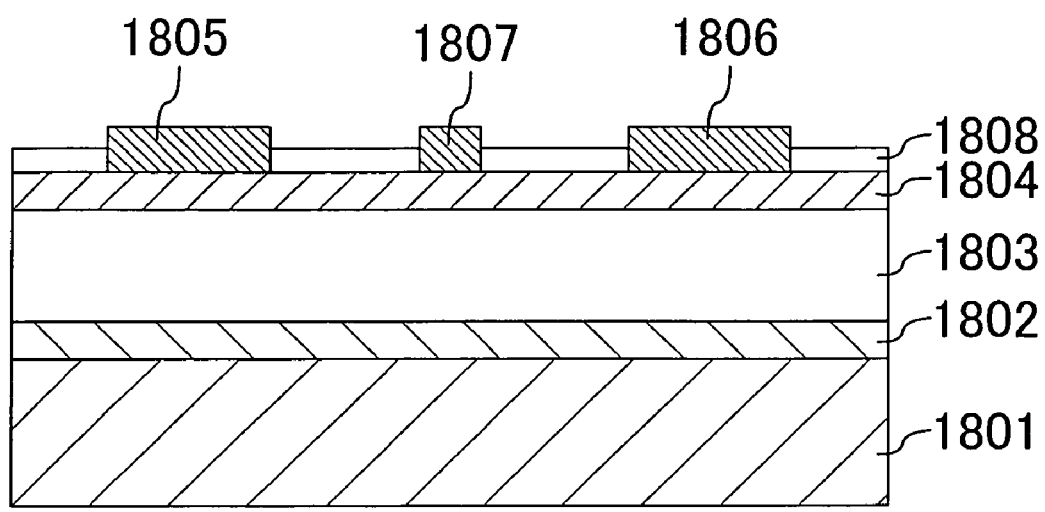
FIG. 8 is a sectional view illustrating a conventional FET having an AlGaN/GaN heterostructure.

Then, as shown in FIG. 7E, a gate electrode 611 made of Pd is formed on the high concentration p-GaN layer 608. Thus, the nitride semiconductor device of the present embodiment is fabricated.

The field effect transistor of the present invention described above is useful as power transistors for use in power supply circuits of consumer products, such as television sets.

What is claimed is:

1. A nitride semiconductor device comprising:
   a substrate;
   a first nitride semiconductor layer formed above the substrate;
   a second nitride semiconductor layer formed on the first nitride semiconductor layer and has band gap energy larger than that of the first nitride semiconductor layer;
   an insulating film formed on or above the second nitride semiconductor layer and has an opening formed at least in part thereof corresponding to a gate region;
   a third nitride semiconductor layer of p-type formed on or above the second nitride semiconductor layer to bury the opening in the gate region and cover the insulating film in part; and
   a gate electrode formed on or above the third nitride semiconductor layer.

2. The nitride semiconductor device of claim 1, wherein the gate electrode is an ohmic electrode.

3. The nitride semiconductor device of claim 1 further comprising:
   a fourth nitride semiconductor layer of p-type formed on the second nitride semiconductor layer and below the third nitride semiconductor layer, wherein
   the insulating film is formed on the fourth nitride semiconductor layer.

4. The nitride semiconductor device of claim 3, wherein the thickness of the fourth nitride semiconductor layer is not larger than the depth of a depletion layer expanding from the interface between the fourth nitride semiconductor layer and the insulating film to the inside of the fourth nitride semiconductor layer.

5. The nitride semiconductor device of claim 1 is normally-off.

6. The nitride semiconductor device of claim 1, wherein
   the first nitride semiconductor layer is made of GaN,
   the second nitride semiconductor layer is made of Al$_x$Ga$_{1-x}$N ($0 \leq x \leq 1$),
   the third nitride semiconductor layer is made of Al$_y$Ga$_{1-y}$N ($0 \leq y \leq 1$) and
   the fourth nitride semiconductor layer is made of Al$_z$Ga$_{1-z}$N ($0 \leq z \leq 1$).

7. A nitride semiconductor device comprising:
   a substrate;
   a first nitride semiconductor layer formed above the substrate;
   a second nitride semiconductor layer formed on the first nitride semiconductor layer and has band gap energy larger than that of the first nitride semiconductor layer;
   a third nitride semiconductor layer of p-type formed on the second nitride semiconductor layer;
   an insulating film formed on the third nitride semiconductor layer and has an opening formed at least in part thereof corresponding to a gate region;
   a fourth nitride semiconductor layer of p-type formed on or above the second nitride semiconductor layer to bury the opening in the gate region; and
   a gate electrode formed on or above the fourth nitride semiconductor layer,
   wherein an n-type conductivity region is generated in the region from the first nitride semiconductor layer to the second nitride semiconductor layer.

8. The nitride semiconductor layer of claim 7, wherein
   the thickness of the third nitride semiconductor layer is not larger than the depth of a depletion layer expanding from the interface between the third nitride semiconductor layer and the insulating film to the inside of the third nitride semiconductor layer.

9. The nitride semiconductor device of claim 1, wherein an n-type conductivity region is generated in the region from the first nitride semiconductor layer to the second nitride semiconductor layer.

10. The nitride semiconductor device of claim 1, wherein the third nitride semiconductor layer covers a part of an upper surface of the insulating film in part.

* * * * *